(12) United States Patent
Huang et al.

(10) Patent No.: US 7,523,007 B2
(45) Date of Patent: Apr. 21, 2009

(54) CALIBRATION DEVICE

(75) Inventors: Li Huang, Westlake Village, CA (US); George W. Conner, Camarillo, CA (US)

(73) Assignee: Teradyne, Inc., North Reading, MA (US)

(*) Notice: Subject to any disclaimer, the term of this patent is extended or adjusted under 35 U.S.C. 154(b) by 0 days.

(21) Appl. No.: 11/771,389

(22) Filed: Jun. 29, 2007

(65) Prior Publication Data
US 2008/0125998 A1 May 29, 2008

Related U.S. Application Data (60) Provisional application No. 60/818,054, filed on Jun. 30, 2006.

(51) Int. Cl.
*G01R 35/00* (2006.01)
(52) U.S. Cl. ..................................................... 702/89
(58) Field of Classification Search ................ 702/85, 702/89, 107, 117, 119; 324/158.1, 754, 763, 324/765; 714/743, 744, 814
See application file for complete search history.

(56) References Cited

U.S. PATENT DOCUMENTS 5,794,175 A * 8/1998 Conner ...................... 702/119

6,298,465 B1  10/2001 Klotchkov
2003/0086376 A1  5/2003 Iorga

OTHER PUBLICATIONS

Syed A.R. "Automatic delay calibration method for multi-channel CMOS formatter" Test, 2004 International Conference On, Charlotte, NC, Oct. 26-28, 2004, pp. 577-586.
International Search Report (PCT/US2007/015182); Date of Mailing: Dec. 7, 2007, 2 pages.

* cited by examiner

*Primary Examiner*—Bryan Bui
(74) *Attorney, Agent, or Firm*—Foley & Lardner LLP; Joseph M. Maraia; Ralph Trementozzi (57) ABSTRACT

A calibration device is provided for use with automatic test equipment (ATE). The calibration device includes circuitry having a fanout circuit. The compare-side fanout circuit has an input connected to a first channel of the ATE and outputs connected to N (N>1) channels of the ATE, where the N channels do not include the first channel. The ATE propagates an edge on the first channel, and the fanout circuit transmits the edge to the N channels. Optionally, a calibration device for use with automatic test equipment includes a drive-side circuit. The drive-side circuit includes circuitry having multiple inputs connected to N (N>1) channels of the ATE and an output connected to a second channel of the ATE that is not one of the N channels. The ATE propagates an edge on each of the N-channels and the circuitry propagates each edge to the second channel of the ATE.

21 Claims, 5 Drawing Sheets

CALIBRATION DEVICE

RELATED APPLICATIONS

The present invention claims priority to and the benefit of U.S. Application Ser. No. 60/818,054 filed on Jun. 30, 2006.

TECHNICAL FIELD

This patent application relates generally to a calibration device for use, e.g., with automatic test equipment (ATE).

BACKGROUND

Automatic test equipment (ATE) refers to an automated, usually computer-driven, system for testing devices, such as semiconductors, electronic circuits, and printed circuit board assemblies. A device tested by ATE is referred to as a device under test (DUT).

ATE typically includes a computer system and a testing device or a single device having corresponding functionality. Pin electronics are typically part of the testing device. Pin electronics can include drivers, comparators and/or active load functionality for testing a DUT. The drivers provide test signals to pins on the testing device.

ATE is typically capable of providing different types of signals to a DUT. Examples of these signals are the test signals noted above, which are used during testing of the DUT (e.g., to test the DUT). The next generation of high speed memory devices operates at a data transfer speed of up to at least 6.4 Gigabits per second (Gbps). A specific type of these devices, namely New Memory Technology (NMT) devices, requires 3 to 6 device input or output lanes (channels) to share one delay adjustment circuit in order to save die area. As a result, testers for NMT devices often need to provide signals with precision lane-to-lane skew, often less than +/−25 ps (picoseconds), at the DUT. Currently-available calibration technology uses a robot to probe at the DUT socket, which is expensive due to robot cost, maintenance costs, and calibration time cost.

DESCRIPTION OF THE DRAWINGS

Like reference numerals in different figures indicate like elements.

SUMMARY

According to an illustrative embodiment, a calibration device is provided for use with automatic test equipment (ATE). The calibration device includes circuitry having a fanout circuit. The fanout circuit has an input connected to a first channel of the ATE and outputs connected to N (N>1) channels of the ATE, where the N channels do not include the first channel. The ATE propagates an edge on the first channel, and the fanout circuit transmits the edge to the N channels.

In a further illustrative embodiment, a calibration device for use with automatic test equipment includes a drive-side circuit. The drive-side circuit includes circuitry having multiple inputs connected to N (N>1) channels of the ATE and an output connected to a second channel of the ATE that is not one of the N channels. The ATE propagates an edge on each of the N-channels and the circuitry propagates each edge to the second channel of the ATE.

In a further illustrative embodiment, a calibration device for use with automatic test equipment includes circuitry having a fanout circuit. The fanout circuit has an input connected to a first channel of the ATE and outputs connected to M (M>1) channels of the ATE, where the M channels do not include the first channel, wherein the ATE propagates an edge on the first channel, and the fanout circuit transmits the edge to the M channel. A drive-side circuit includes circuitry having multiple inputs connected to N (N>1) channels of the ATE and an output connected to a second channel of the ATE that is not one of the N channels; wherein the ATE propagates an edge on each of the N-channels and the circuitry propagates each edge to the second channel of the ATE.

In a further illustrative embodiment, a method of calibration includes propagating an edge on a first channel of a signal source. Via a fanout circuit, the edge is transmitted to N channels, the fanout circuit having an input connected to the first channel and outputs connected to N (N>1) channels of the signal source, where the N channels do not include the first channel. A measurement is obtained, the measurement corresponding to the edge at each of the N channels, where differences in measurements between the edges at each of the N channels corresponds to comparator lane-to-lane skew.

In a further illustrative embodiment, a method of calibration includes propagating an edge to each of N-channels of a signal source. Propagating the edge at each of the N-channels is also performed, via a drive-side circuit having multiple inputs connected to the N (N>1) channels of the signal source, to a second channel of the signal source that is not one of the N channels. Also, measurements are obtained corresponding to times that the edges at each of the N-channels are received, wherein a difference in measurements corresponds to driver-side skew.

In a further illustrative embodiment, a method of calibration provides propagating a first edge on a first channel of a signal source. Via fanout circuit, the first edge is transmitted to M channels. The fanout circuit has an input connected to the first channel and outputs connected to M (M>1) channels of the signal source, where the M channels do not include the first channel. A measurement is obtained corresponding to the first edge at each of the M channels, where differences in measurements between the first edges at each of the M channels corresponds to comparator lane-to-lane skew. A second edge is propagated to each of N-channels of the signal source. Further, the second edge is propagated at each of the N-channels, via a drive-side circuit having multiple inputs connected to the N (N>1) channels of the signal source, to a second channel of the signal source that is not one of the N channels. Measurements are obtained corresponding to times that the second edges at each of the N-channels are received, wherein a difference in measurements corresponds to driver-side skew.

In a further illustrative embodiment, a computer program product has instructions executable using a data processing apparatus. The instructions include propagating an edge on a first channel of a signal source and transmitting, via a fanout circuit, the edge to N channels. The fanout circuit has an input connected to the first channel and outputs connected to N (N>1) channels of the signal source, where the N channels do not include the first channel. A measurement is obtained corresponding to the edge at each of the N channels, where differences in measurements between the edges at each of the N channels corresponds to comparator lane-to-lane skew.

In a further illustrative embodiment, a computer program product has instructions executable using a data processing apparatus. The instructions include propagating an edge to each of N-channels of a signal source and propagating the edge at each of the N-channels, via a drive-side circuit. The drive-side circuit has multiple inputs connected to the N (N>1) channels of the signal source, to a second channel of the signal source that is not one of the N channels. Measurements are obtained corresponding to times that the edges at each of the N-channels are received, wherein a difference in measurements corresponds to driver-side skew.

In a further illustrative embodiment, a computer program product has instructions executable using a data processing apparatus. The instructions include propagating a first edge on a first channel of a signal source. Via fanout circuit, the first edge is transmitted to M channels. The fanout circuit has an input connected to the first channel and outputs connected to M (M>1) channels of the signal source, where the M channels do not include the first channel. A measurement is obtained corresponding to the first edge at each of the M channels, where differences in measurements between the first edges at each of the M channels corresponds to comparator lane-to-lane skew. A second edge is propagated to each of N-channels of the signal source. Further, the second edge is propagated at each of the N-channels, via a drive-side circuit having multiple inputs connected to the N (N>1) channels of the signal source, to a second channel of the signal source that is not one of the N channels. Measurements are obtained corresponding to times that the second edges at each of the N-channels are received, wherein a difference in measurements corresponds to driver-side skew.

DETAILED DESCRIPTION

Figure 1:
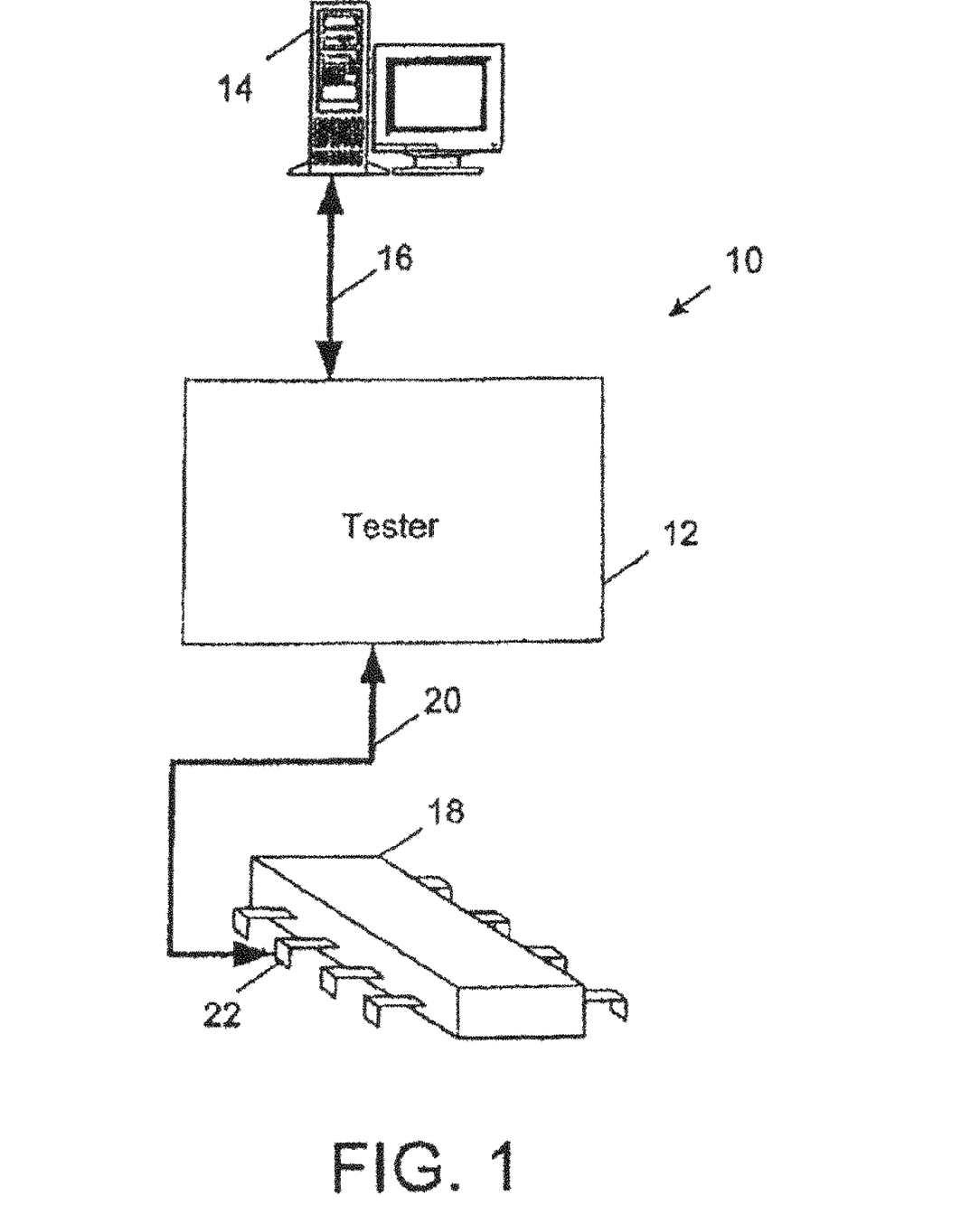
FIG. 1 is a block diagram of ATE for testing devices.

Various embodiments of the present invention seek to provide greater lane-to-lane skew accuracy, as well as a more efficient and durable calibration approach. Referring to FIG. 1, a system 10 for testing a device-under-test (DUT) 18, such as a semiconductor device, includes a tester 12, such as automatic test equipment (ATE) or other similar testing device. To control the tester 12, the system 10 includes a computer system 14 that interfaces with the tester 12 over a hardwire connection 16. Typically, the computer system 14 sends commands to the tester 12 that initiate the execution of routines and functions for testing the DUT 18. Such executing test routines may initiate the generation and transmission of test signals to the DUT 18 and collect responses from the DUT. Various types of DUTs may be tested by the system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, the tester 12 is connected to one or more connector pins that provide an interface for the internal circuitry of the DUT 18. To test some DUTs, e.g., sixty-four or one hundred twenty-eight connector pins, or more, may be interfaced to the tester 12. For illustrative purposes, in this example, the semiconductor device tester 12 is connected to one connector pin of the DUT 18 via a hardwire connection. A conductor 20 (e.g., cable) is connected to a pin 22 and is used to deliver test signals (e.g., PMU test signals, PE test signals, etc.) to the internal circuitry of the DUT 18. The conductor 20 also senses signals at the pin 22 in response to the test signals provided by the semiconductor device tester 12. For example, a voltage signal or a current signal may be sensed at the pin 22 in response to a test signal and sent over the conductor 20 to the tester 12 for analysis.

Such single port tests may also be performed on other pins included in the DUT 18. For example, the tester 12 may provide test signals to other pins and collect associated signals reflected back over conductors, such as those that deliver the provided signals. By collecting the reflected signals, the input impedance of the pins may be characterized along with other single port testing quantities. In other test scenarios, a digital signal may be sent over the conductor 20 to the pin 22 for storing a digital value on the DUT 18. Once the digital value is stored, the DUT 18 may be accessed to retrieve and send the stored digital value over the conductor 20, or another conductor, to the tester 12. The retrieved digital value may then be identified to determine if the proper value was stored on the DUT 18.

Along with performing one-port measurements, a two-port test may also be performed by the semiconductor device tester 12. For example, a test signal may be injected over the conductor 20 into the pin 22 and a response signal may be collected from one, two or more other pins of the DUT 18. This response signal may be provided to the semiconductor device tester 12 to, for example, determine quantities, such as gain response, phase response, and other throughput measurement quantities.

Figure 2:
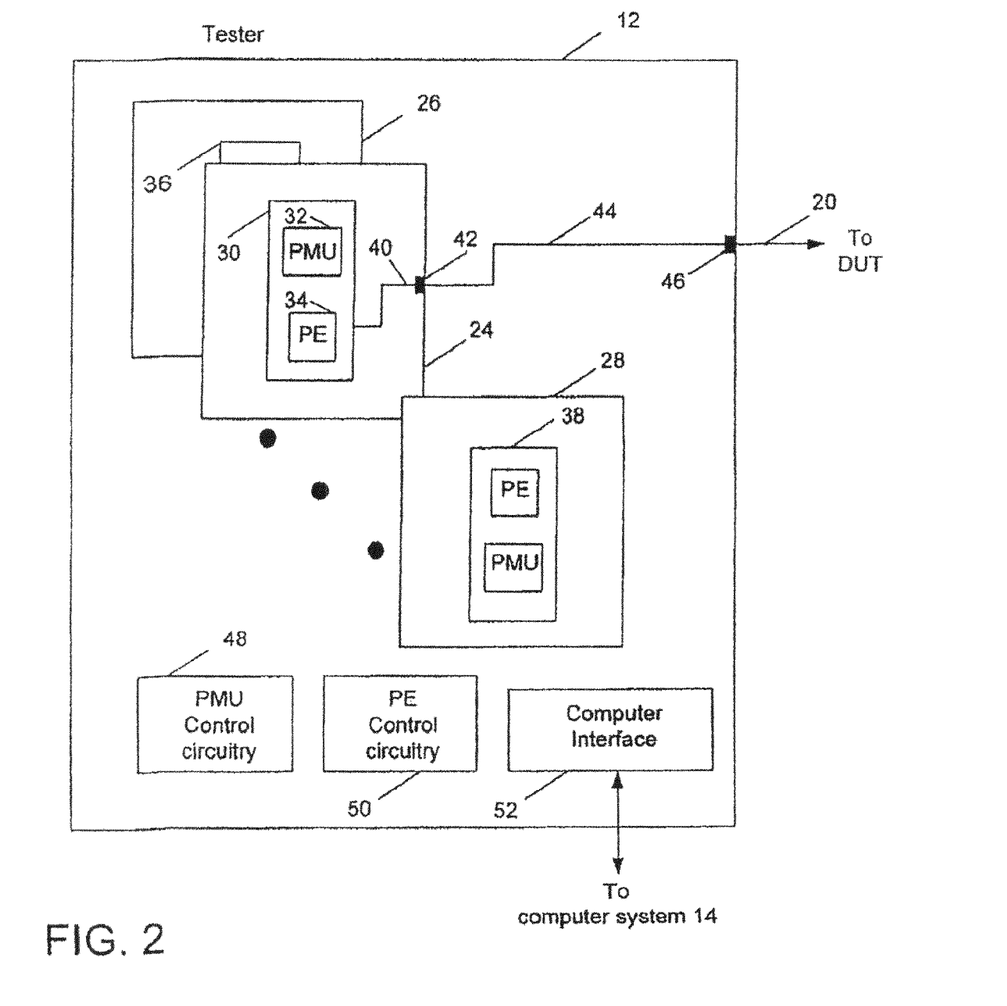
FIG. 2 is a block diagram of a tester used in the ATE.

Referring also to FIG. 2, to send and collect test signals from multiple connector pins of a DUT (or multiple DUTs), semiconductor device tester 12 includes an interface card 24 that can communicate with numerous pins. For example, the interface card 24 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Output channels typically include drivers (not shown) to provide signals to a DUT, and input channels typically include comparators (also not shown) to, e.g., receive input signals, compare them to a reference, and provide an output. Along with having many channels on an interface card, such as by including multiple interface cards in tester 12, the overall number of channels increases, thereby further reducing testing time. In this example, two additional interface cards 26 and 28 are shown to demonstrate that multiple interface cards may populate the tester 12.

According to the illustrative embodiment, each interface card can include a dedicated integrated circuit (IC) chip (e.g., an application specific integrated circuit (ASIC)) for performing particular test functions. For example, the interface card 24 includes an IC chip 30 for performing parametric measurement unit (PMU) tests and pin electronics (PE) tests. The IC chip 30 has a PMU stage 32 that includes circuitry for performing PMU tests and a PE stage 34 that includes circuitry for performing PE tests. Additionally, the interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 18) and collecting responses to further characterize the performance of the DUT. For example, IC chip 30 may transmit (to the DUT) AC test signals that represent a vector of binary values for storage on the DUT. Once these binary values have been stored, the DUT may be accessed by the tester 12 to determine if the correct binary values have been stored. Since digital signals typically include abrupt voltage transitions, the circuitry in PE stage 34 on IC chip 30 can operate at a relatively high speed in comparison to the circuitry in the PMU stage 32.

To pass both DC and AC test signals from the interface card 24 to the DUT 18, a conducting trace 40 connects the IC chip 30 to an interface board connector 42 that allows signals to be passed on and off interface board 24. The interface board connector 42 is also connected to a conductor 44 that is connected to an interface connector 46, which allows signals to be passed to and from the tester 12. In this example, the conductor 20 is connected to interface connector 46 for bi-directional signal passage between the tester 12 and the pin 22 of the DUT 18. In some arrangements, an interface device may be used to connect one or more conductors from the tester 12 to the DUT. For example, the DUT (e.g., DUT 18) may be mounted onto a device interface board (DIB) for providing access to each DUT pin. In such an arrangement, the conductor 20 may be connected to the DIB for placing test signals on the appropriate pin(s) (e.g., pin 22) of the DUT.

In this example, only the conducting trace 40 and the conductor 44 respectively connect the IC chip 30 and the interface board 24 for delivering and collecting signals. However, the IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, the tester 12 may connect to two or more DIB's for interfacing the channels provided by the interface cards 24, 26, and 28 to one or multiple devices under test.

To initiate and control the testing performed by the interface cards 24, 26, and 28, the tester 12 includes PMU control circuitry 48 and PE control circuitry 50 that provide test parameters (e.g., test signal voltage level, test signal current level, digital values, etc.) for producing test signals and analyzing DUT responses. The PMU control circuitry and PE control circuitry may be implemented using one or more processing devices Examples of processing devices include, but are not limited to, a microprocessor, a microcontroller, programmable logic (e.g., a field-programmable gate array), and/or combination(s) thereof. The tester 12 also includes a computer interface 52 that allows the computer system 14 to control the operations executed by the tester 12 and also allows data (e.g., test parameters, DUT responses, etc.) to pass between the tester 12 and computer system 14.

Described below is a calibration device that can interface to the ATE tester, e.g., by insertion into a DUT socket on the DIB. Once inside the socket, the calibration device can communicate with the tester and thereby enable lane-to-lane skew measurements, and subsequent calibration by the tester, which can result in calibrated lane-to-lane skew of, e.g., +/−25 ps or better, within a group of lanes. In this implementation, a lane may be, for example, a tester communication path that is typically for use in communicating to a DUT. The number of lanes within a group of lanes being calibrated can be customized in accordance with DUT requirements. A group of 6 lanes is used for the example below.

Figure 3:
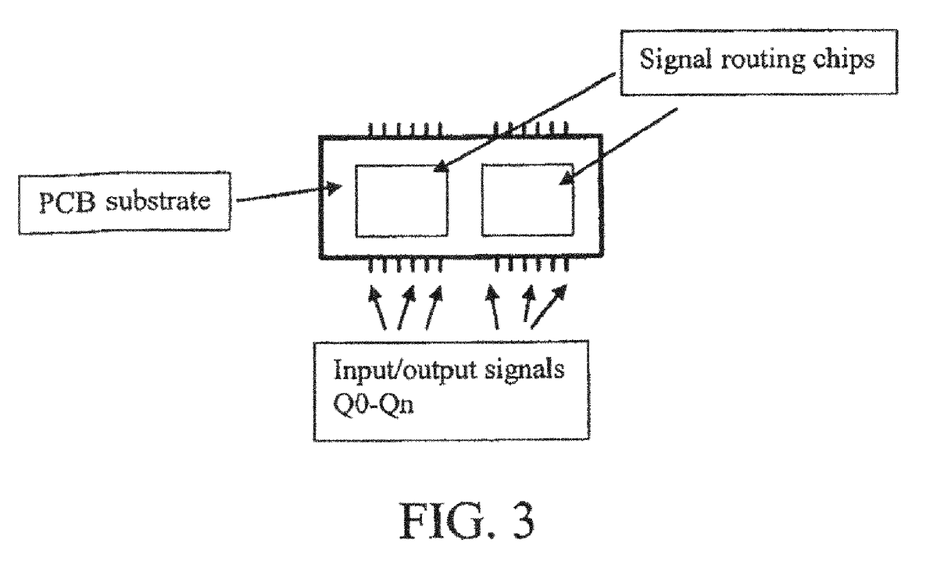
FIG. 3 is a block diagram of a skew calibration device for use with the ATE.

One implementation of the calibration device is shown in FIG. 3. The calibration device of FIG. 3 includes one or multiple high-precision signal routing devices (chips, in this implementation), which may be custom or commercially-available, and a printed circuit board (PCB) substrate, which include trace(s) to route input and output signals of the calibration device to appropriate routing chip(s). The PCB substrate may have the same form factor as a device (DUT) and, therefore, can make contact with the DUT socket (e.g., on the tester) in the same way as a DUT.

Figure 4:
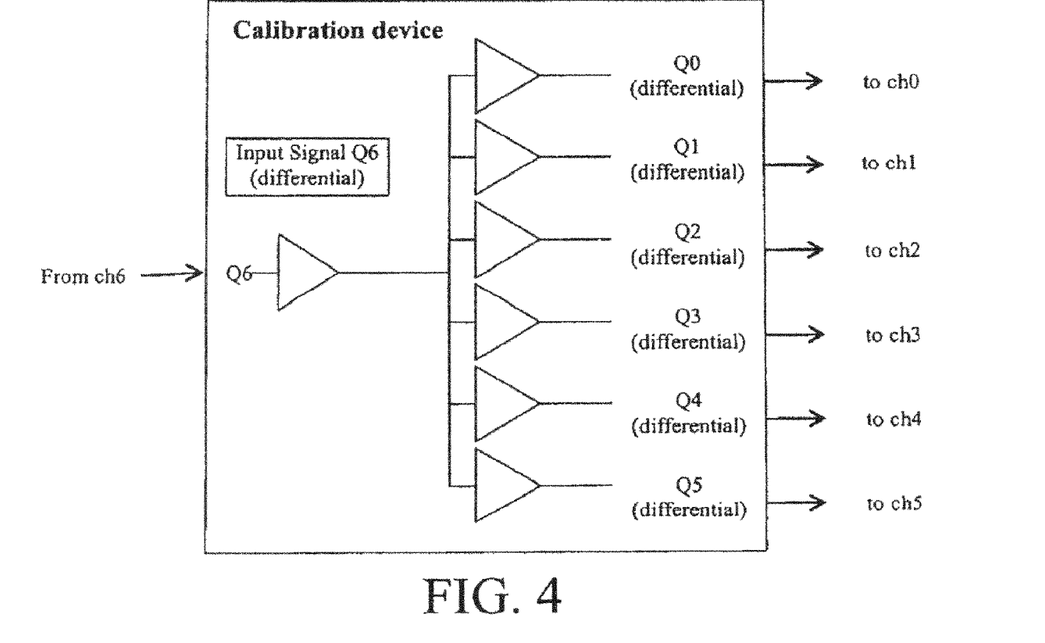
FIG. 4 is a block diagram of a signal routing chip in the skew calibration device for comparator lane-to-lane skew measurements.

In this implementation, there are two types of signal routing techniques on each calibration device: one for compare-side skew measurement and one for drive-side skew measurement. The implementation for compare-side skew is shown in FIG. 4. This implementation connects a tester channel (e.g., ch6), which is not part of the channel group to be calibrated (e.g., ch0-ch5), to the input (Q6) of a high-precision clock fanout chip. The outputs of the clock fanout chip (Q0-Q5) are connected to the channel group (ch0-ch5) via the traces on the PCB substrate. These trace lengths may be well-matched to be within 5 mil (0.5% of an inch). Calibration is performed by generating an edge on the input lane (ch6), which is fanned-out to the channel group through the calibration device and which is measured by the comparator of each tester channel. The difference in measured values represents the comparator lane-to-lane skew, and can be compensated by the tester by adjusting the appropriate calibration delay within each comparator.

Figure 5:
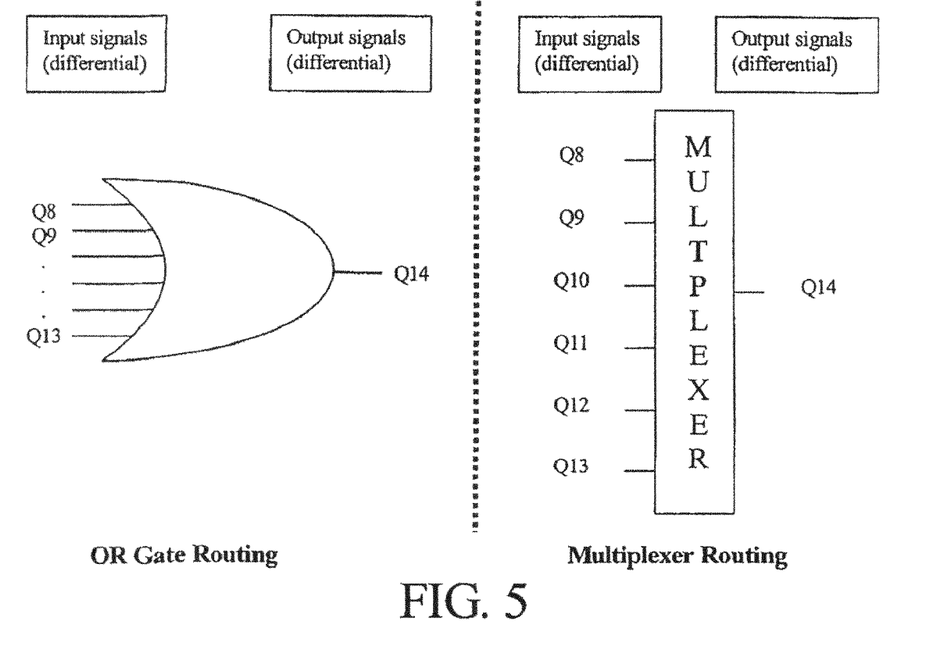
FIG. 5 shows block diagrams of exemplary signal routing chips for driver lane-to-lane skew measurements.

Referring to FIG. 5, the implementation for drive-side skew measurement uses a precision logic OR gate or multiplexer to connect a group of channels (e.g. Q8-Q13) to one output (e.g. Q14). According to the example implementation, one by one, every channel in the group sends an identically-programmed (or at least substantially-identically-programmed) edge through the calibration device to the output (Q14), which is connected to a tester channel (ch14) outside of the group. The comparator of this channel measures the edge time of all the channels within the input group, and the difference in the measurements (e.g., differences in received edge times) reveals the skew of the driver output. This skew can be compensated by the tester by adjusting the appropriate delay (e.g., driver timing) of each drive channel.

This calibration device enables a parallel calibration process for multiple device test sites that only takes minutes, or less, to achieve lane-to-lane accuracy of, e.g., +/25 ps (or less), making the calibration device superior to at least some conventional robots.

The ATE and calibration device are not limited to the hardware and software described above. The ATE and/or calibration device, or any portion thereof, can be implemented, at least in part, via a computer program product, i.e., a computer program tangibly embodied in an information carrier, such as one or more machine-readable media or a propagated signal, for execution by, or to control the operation of, one or more data processing apparatus, e.g., a programmable processor, a computer, multiple computers, and/or programmable logic elements.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing calibration and/or testing can be performed by one or more programmable processors executing one or more computer programs to perform the functions of the calibration process. All or part of the ATE and/or calibration device can be implemented as, special purpose logic circuitry. Examples can include, but are not limited to an FPGA (field programmable gate array) and an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Elements of different embodiments described herein may be combined to form other embodiments not specifically set forth above. Other embodiments not specifically described herein are also within the scope of the following claims.

What is claimed is:

1. A calibration device for use with automatic test equipment (ATE), comprising:
   circuitry comprising a fanout circuit, the fanout circuit having an input connected to a first channel of the ATE and outputs connected to N (N>1) channels of the ATE, where the N channels do not include the first channel;
   wherein the ATE propagates an edge on the first channel, and the fanout circuit transmits the edge to the N channels; and
   comparators corresponding to each of the N channels, each comparator for obtaining a measurement corresponding to a respective edge, where differences in measurements of respective edges corresponds to comparator lane-to-lane skew.

2. The ATE of claim 1, further comprising:
   circuitry to perform an adjustment to compensate for the lane-to-lane skew, the adjustment affecting timing associated with the comparators.

3. The ATE of claim 1, wherein the fanout circuit output is connected to the channels of the ATE via traces on a printed circuit board substrate that are length matched to each other.

4. A calibration device for use with automatic test equipment (ATE), comprising:
   a drive-side circuit comprising circuitry having multiple inputs connected to N (N>1) channels of the ATE and an output connect to a second channels of the ATE that is not one of the N channels;
   wherein the ATE propagates an edge on each of the N-channels and the circuitry propagates each edge to the second channel of the ATE; and
   a comparator corresponding to the second channel, the comparator obtaining measurements corresponding to times that edges of the N-channels are received, wherein a difference in measurements corresponds to driver-side skew.

5. The calibration device of claim 4, wherein the circuitry comprises an OR gate.

6. The calibration device of claim 4, wherein the circuitry comprises a multiplexer.

7. The ATE of claim 4, further comprising:
   circuitry to perform an adjustment to compensate for the driver-side skew, the adjustment affecting timing associated with drivers that correspond to the N channels.

8. A calibration device for use with automatic test equipment (ATE), comprising:
   circuitry comprising a fanout circuit, the fanout circuit having an input connected to a first channel of the ATE and outputs connected to M (M>1) channels of the ATE, where the M channels, and the fanout circuit transmits the edge to the M channels;
   a driver-side circuit comprising circuitry having multiple inputs connected to N (N>1) channels of the ATE and an output connected to a second channel of the ATE that is not one of the N channels; wherein the ATE propagates an edge on each of the N-channels and the circuitry transmits each edge to the second channel of the ATE; and
   comparators corresponding to each of the M channels, each comparator for obtaining a measurement corresponding to a respective edge, where differences in measurements of respective edges corresponds to comparator lane-to-lane skew.

9. A method of calibration, comprising:
   propagating an edge on first channel of a signal source;
   transmitting, via a fanout circuit, the edge to N channels, the fanout circuit having an input connected to the first channel and outputs connected to N (N>1) channels of the signal source, where the N channels do not include the first channel; and
   obtaining a measurement corresponding to the edge at each of the N channels, where differences in measurements between the edges at each of the N channels corresponds to comparator lane-to-lane skew.

10. The method of claim 9, further comprising:
    adjusting to compensate for the lane-to-lane skew, the adjustment affecting timing associated with a plurality of comparators associated with each of the N channels.

11. The method of claim 9, wherein, in the act of propagating an edge, the signal source is automatic test equipment.

12. A method of calibration, comprising:
    propagating an edge to each of N-channels of a signal source;
    propagating the edge at each of the N-channels, via a drive-side circuit having multiple inputs connected to the N (N>1) channels of the signal source, to a second channel of the signal source that is not on of the N channels; and
    obtaining measurement corresponding to times that the edges at each of the N-channels are received, wherein a difference in measurements corresponds to driver-side skew.

13. The method of claim 12, further comprising:
    adjusting to compensate for the driver-side skew by adjusting a delay of each of the N-channels.

14. The method of claim 12, wherein, in the act of propagating an edge to each of N-channnels of a signal source, the signal source is automatic test equipment.

15. The method of claim 12, wherein, in the act of propagating the edge at each of the N-channels, the drive-side circuit comprises an OR gate.

16. The method of claim 12, wherein, in the act of propagating the edge at each of the N-channels, the drive-side circuit comprises a multiplexer.

17. A method of calibration, comprising:
    propagating a first edge on a first channel of a signal source;
    transmitting via a fanout circuit, the first edge to M channels, the fanout circuit having an input connected to the first channel and outputs connected to M (M>1) channels of the signal source, where the M channels do not include the first channel;
    obtaining a measurement corresponding to the first edge at each of the M channels, where differences in measurements between each of the first edges at each of the M channels corresponds to comparator lane-to-lane skew;
    propagating a second edge to each of N-channels of the signal source;
    propagating the second edge at each of the N-channels via a drive-side circuit having multiple inputs connected to the N (N>1) channels of the signal source, to a second channel of the signal source that is not one of the N channels; and obtaining measurements corresponding to times that the second edges at each of the N-channels are received, wherein a difference in measurements corresponds to driver-side skew.

18. The method of claim 17, wherein the signal source is automatic test equipment.

19. A computer program product having instructions stored on computer readable medium, executable using a data processing apparatus, the instructions comprising:

propagating an edge on a first channel of a signal source;

transmitting, via a fanout circuit, the edge to N channels, the fanout circuit having an input connected to the first channel and outputs connected to N (N>1) channels of the signal source, where the N channels do not include the first channel; and obtaining a measurement corresponding to the edge at each of the N channels, where differences in measurements between the edges at each of the N channels corresponds to comparator lane-to-lane skew.

20. A computer program product having instructions stored on computer readable medium, executable using a data processing apparatus, the instructions comprising:

propagating an edge to each of N-channels of a signal source;

propagating the edge at each of the N-channels, via a drive-side circuit having multiple inputs connected to the N (N>1) channels of the signal source, to a second channel of the signal source that is not one of the N channels; and obtaining measurements corresponding to times that the edges at each of the N-channels are received, wherein a difference in measurements corresponds to driver-side skew.

21. A computer program product having instructions stored on computer readable medium, executable using a data processing apparatus, the instructions comprising:

propagating a first edge on a first channel of a signal source;

transmitting, via a fanout circuit, the first edge to M channels, the fanout circuit having an input connected to the first channel and outputs connected to M (M>1) channels of the signal source, where the M channels do not include the first channel; and obtaining a measurement corresponding to the first edge at each of the M channels, where differences in measurements between each of the first edges at each of the M channels corresponds to comparator lane-to-lane skew, propagating a second edge to each of N-channels of the signal source;

propagating the second edge at each of the N-channels, via a drive-side circuit having multiple inputs connected to the N (N>1) channels of the signal source, to a second channel of the signal source that is not one of the N channels; and obtaining measurements corresponding to times that the second edges at each of the N-channels are received, wherein a difference in measurements corresponds to driver-side skew.

* * * * *

UNITED STATES PATENT AND TRADEMARK OFFICE
CERTIFICATE OF CORRECTION

PATENT NO.        : 7,523,007 B2
APPLICATION NO.   : 11/771389
DATED             : June 29, 2009
INVENTOR(S)       : Huang et al.

It is certified that error appears in the above-identified patent and that said Letters Patent is hereby corrected as shown below:

Claim 4, column 7, lines 36-39 currently read as follows:

"a drive-side circuit comprising circuitry having multiple inputs connected to N (N>1) channels of the ATE and an output connect to a second channels of the ATE that is not one of the N channels;"

Please correct Claim 4, column 7, lines 36-39 to read as follows:

--a drive-side circuit comprising circuitry having multiple inputs connected to N (N>1) channels of the ATE and an output connected to a second channel of the ATE that is not one of the N channels;--

Claim 9, column 8, lines 9-10 currently read as follows:

"9. A method of calibration, comprising: propagating an edge on first channel of a signal source;"

Please correct Claim 9, column 8, lines 9-10 to read as follows:

--9. A method of calibration, comprising: propagating an edge on a first channel of a signal source;--

Claim 12, column 8, lines 29-37 currently read as follows:

"propagating the edge at each of the N-channels, via a drive-side circuit having multiple inputs connected to the N (N>1) channels of the signal source to a second channel of the signal source that is not on of the N channels; and obtaining measurement corresponding to times that the edges at each of the N-channels are received, wherein a difference in measurements corresponds to driver-side skew"

Please correct Claim 12, column 8, lines 29-37 to read as follows:

--propagating the edge at each of the N-channels, via a drive-side circuit having multiple inputs connected to the N (N>1) channels of the signal source to a second channel of the signal source that is not one of the N channels; and obtaining measurements corresponding to times that the edges at each of the N-channels are received, wherein a difference in measurements corresponds to driver-side skew--

UNITED STATES PATENT AND TRADEMARK OFFICE
CERTIFICATE OF CORRECTION

PATENT NO. : 7,523,007 B2
APPLICATION NO. : 11/771389
DATED : June 29, 2009
INVENTOR(S) : Huang et al.

It is certified that error appears in the above-identified patent and that said Letters Patent is hereby corrected as shown below:

Claim 14, column 8, lines 41-43 currently read as follows:

"14. The method of claim 12, wherein, in the act of propagating an edge to each of N-channnels of a signal source the signal source is automatic test equipment"

Please correct Claim 14, column 8, lines 41-43 to read as follows:

--14. The method of claim 12, wherein, in the act of propagating an edge to each of N-channels of a signal source the signal source is automatic test equipment--

Signed and Sealed this

Seventh Day of July, 2009

JOHN DOLL
*Acting Director of the United States Patent and Trademark Office*